United States Patent
Zhang et al.

(10) Patent No.: US 9,733,302 B2
(45) Date of Patent: Aug. 15, 2017

(54) CIRCUIT FOR MONITORING METAL DEGRADATION ON INTEGRATED CIRCUIT

(71) Applicant: FREESCALE SEMICONDUCTOR, INC., Austin, TX (US)

(72) Inventors: Zhichen Zhang, Beijing (CN); John M. Pigott, Phoenix, AZ (US); Chuanzheng Wang, Beijing (CN); Qilin Zhang, Beijing (CN); Michael J. Zunino, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 123 days.

(21) Appl. No.: 14/846,813

(22) Filed: Sep. 6, 2015

(65) Prior Publication Data

US 2016/0216318 A1 Jul. 28, 2016

(30) Foreign Application Priority Data

Jan. 23, 2015 (CN) .......................... 2015 1 0063397

(51) Int. Cl.
*G01R 31/3187* (2006.01)
*G01R 31/28* (2006.01)

(52) U.S. Cl.
CPC ..... *G01R 31/2879* (2013.01); *G01R 31/2817* (2013.01); *G01R 31/2818* (2013.01)

(58) Field of Classification Search
CPC ............ G01R 31/2879; G01R 31/2818; G01R 31/2817

(Continued)

(56) References Cited

U.S. PATENT DOCUMENTS 4,327,332 A 4/1982 Malchow
5,057,879 A * 10/1991 Pigott et al. .......... H01L 29/861
257/603

(Continued)

OTHER PUBLICATIONS

Atma-Sphere Music Systems, Inc., "Understanding Our Basic Circuits", 2010.

(Continued)

*Primary Examiner* — Giovanni Astacio-Oquendo
(74) *Attorney, Agent, or Firm* — Charles E. Bergere

(57) ABSTRACT

An integrated circuit (IC) having a heat-generating element, such as a power MOSFET, a current-carrying conductor coupled to the heat-generating element, a sense conductor adjacent the current-carrying conductor, and a failure-detection circuit coupled to the sense conductor. When thermal cycling of the IC causes the resistance of the sense conductor to become greater than a temperature-dependent threshold value, the failure-detection circuit generates a signal indicating that the integrated circuit will soon fail. The resistance of the sense conductor is determined by injecting a current into the sense conductor to generate a voltage. The temperature-dependent threshold value is a voltage generated by injecting a current into a reference conductor disposed away from the current-carrying and sense conductors. A voltage comparator compares the two voltages to generate the output. Alternatively, the failure-detection circuit includes a processor that calculates the temperature-dependent threshold value from a temperature measurement taken on the integrated circuit.

19 Claims, 6 Drawing Sheets

(58) Field of Classification Search
USPC .................................... 324/750.3, 500, 537
See application file for complete search history.

(56) References Cited

U.S. PATENT DOCUMENTS

| | | | |
|---|---|---|---|
| 5,264,377 | A | 11/1993 | Chesire et al. |
| 5,625,288 | A | 4/1997 | Snyder |
| 5,886,515 | A | 3/1999 | Kelly |
| 5,905,855 | A | 5/1999 | Klaiber et al. |
| 6,097,075 | A * | 8/2000 | Rozsypal et al. ..... H01L 27/088 257/368 |
| 6,587,994 | B1 | 7/2003 | Yamaji |
| 6,603,328 | B2 | 8/2003 | Takahashi |
| 6,731,179 | B2 | 5/2004 | Abadeer |
| 7,026,838 | B2 | 4/2006 | Reddy |
| 7,141,990 | B2 | 11/2006 | Bast et al. |
| 7,271,608 | B1 | 9/2007 | Vermeire |
| 7,338,817 | B2 | 3/2008 | Liu |
| 7,400,162 | B2 | 7/2008 | Gattiker |
| 7,486,098 | B2 | 2/2009 | Gattiker |
| 7,504,847 | B2 | 3/2009 | Goodnow |
| 7,564,256 | B2 | 7/2009 | Gattiker |
| 7,759,960 | B2 | 7/2010 | Gattiker |
| 7,853,851 | B1 | 12/2010 | Beckman et al. |
| 7,974,595 | B2 | 7/2011 | Reddy |
| 8,081,003 | B2 | 12/2011 | Pacha et al. |
| 8,248,095 | B2 | 8/2012 | Noorlag et al. |
| 8,274,301 | B2 | 9/2012 | Feng et al. |
| 8,325,452 | B2 | 12/2012 | Ichikawa |
| 8,693,271 | B2 | 4/2014 | Raval |
| 9,222,968 | B2 * | 12/2015 | Zhang et al. ...... G01R 31/2856 |
| 2006/0145751 | A1 | 7/2006 | Gangasani |
| 2010/0020499 | A1 * | 1/2010 | Lee et al. ............ H01L 23/3677 361/709 |
| 2011/0108245 | A1 * | 5/2011 | Tan et al. ................ F28D 15/04 165/104.26 |
| 2012/0096323 | A1 | 4/2012 | Tachibana |
| 2012/0161885 | A1 | 6/2012 | Saneyoshi |
| 2012/0259575 | A1 | 10/2012 | Graas et al. |
| 2013/0188795 | A1 | 7/2013 | Quan |
| 2013/0221987 | A1 | 8/2013 | Cranford, Jr. et al. |
| 2014/0132293 | A1 | 5/2014 | Abadir et al. |
| 2017/0098592 | A1 * | 4/2017 | Jin et al. .............. H01L 23/427 |

OTHER PUBLICATIONS

Banyamin and Berwick, "The Gain Advantages of Four Cascaded Single Stage Distributed Amplifier Configurations", Dept. of Electronic and Computing Engineering, Brunel University, IEEE MTT-S Digest, 2000.

Kim at al., "Impact Analysis of NBT/PBTI on SRAM Vmin and Design Techniques for Improved SRAM Vmin", Journal of Semiconductor Technology and Science, Vo. 13, No. 2, Apr. 2013.

Raffo et al., "An Automated Mearurement Systemfor the Characterization of Electron Device Degradation Under Nonlinear Dynamic Regime", IEEE Transactions on instrumentation and Measurement, vol. 58, No. 8, Aug. 2009.

Satoh, Shingo; "Improvement of Degradation Detection in ESD test for Semiconductor Products" ITES Co. Ltd., IEEE 2002.

* cited by examiner

CIRCUIT FOR MONITORING METAL DEGRADATION ON INTEGRATED CIRCUIT

BACKGROUND OF THE INVENTION

The present invention relates generally to integrated circuits and, more particularly, to monitoring metal conductor resistivity for possible failure due to thermal cycling of the integrated circuit.

Voltage regulators integrated circuits are well known. Generally, a voltage regulator is used to provide a desired constant voltage over a wide range of current supplied to a load, such as a microcontroller. Each voltage regulator includes one or more power devices, such as a metal-oxide-semiconductor field-effect transistor (MOSFET) or bipolar transistor, operating as a switch or a pass transistor to couple current to the load. As a consequence of conducting current, the power device generates heat that warms the chip, the hottest portion of the chip (a "hotspot") being proximate the power device. To protect the chip from overheating such as during an overload condition (e.g., when supplying current to an abnormal load such as a short circuit), a temperature sensor on the chip disables the power device from conducting when the chip reaches a maximum temperature. The power device remains disabled until the temperature drops below a temperature deemed safe for the chip to operate. Under worst-case conditions, the voltage regulator chip might cycle between the maximum temperature and the safe operating temperature several hundred times per second until the abnormal load is removed.

A typical voltage regulator chip will have two or more layers of metal conductors overlying the power devices and other components (e.g., resistors, non-power transistors, diodes, etc.) formed in the substrate of the chip. Each thermal cycle of the chip causes the metal conductors on the chip to expand and contract, resulting in stresses on the conductors. These stresses can, with each cycle, damage the metal conductors. The damage might be most predominant in the conductors formed in the top metal layer because those conductors are generally the widest, carry the most current, and are used to interconnect with other chips or external circuitry using interconnects such as bond wires or solder balls. The accumulated effect of the thermal cycling on the top metal conductors might result in an unacceptable and irreversible increase in the resistance of the metal conductors carrying the most current, thereby causing the chip to fail. Accordingly, it would be advantageous to have a technique for providing an indication that the chip is about to fail due to, for example, the above-described effects of thermal cycling.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not been drawn to scale. For example, the thicknesses of layers and sizes of regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

In one embodiment of the invention, an integrated circuit is provided having a heat-generating element, a first metal conductor coupled to the heat-generating element, a second metal conductor adjacent the first metal conductor, and a failure-prediction circuit coupled to the second metal conductor. The failure-prediction circuit is configured to generate at an output a signal when a resistance of the second metal conductor is greater than a temperature-dependent threshold value, the signal indicating that the integrated circuit will soon fail.

Figure 1:
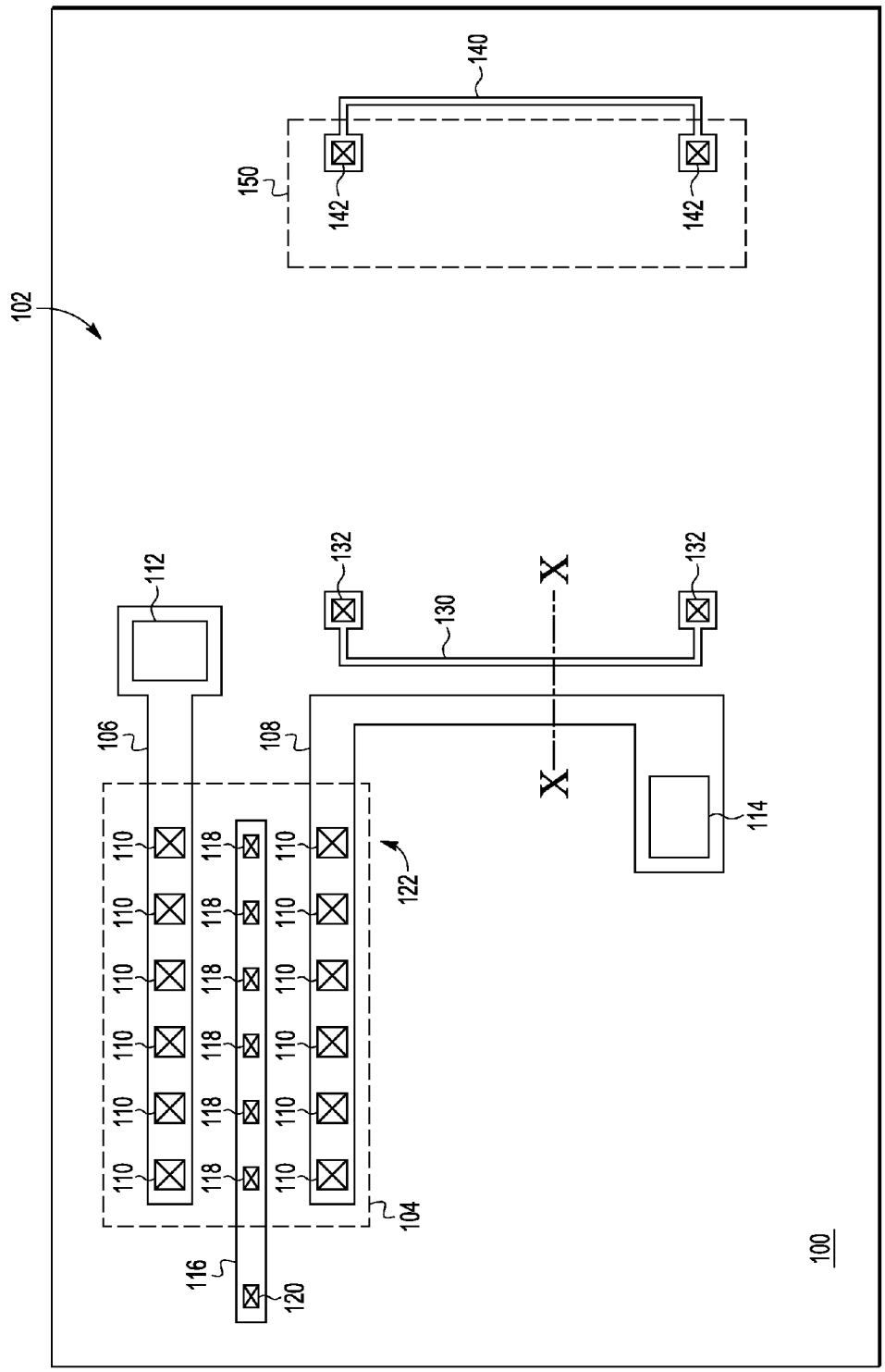
FIG. 1 is a schematic block diagram of an exemplary integrated circuit in accordance with various embodiments of the invention.

Referring now to FIG. 1, a schematic circuit diagram of an integrated circuit (IC) or chip 100 showing certain top metal layer conductors, a power device, and portions of a circuit used for detecting imminent failure of the IC 100. In one embodiment, the IC 100 is a voltage regulator adapted to provide a substantially constant voltage over a wide range of current supplied to a load such as a microcontroller. Note that alternative embodiments are not limited to voltage regulators but might include power amplifiers or motor controllers or the like adapted to provide high currents to a load such as an electrical motor.

The IC 100 comprises a substrate (not shown) of a semiconductor material such as silicon, gallium arsenide, etc., in which transistors, diodes, and other devices or components, active or passive, are formed. Over the substrate are one or more metal layers 102 for interconnecting the components in the substrate and to couple the components to external circuitry (not shown) using interconnects such as bond wires or solder balls (not shown) that form part of a conventional and well-known package (not shown) for the IC 100. In a typical integrated circuit, the metal conductors are generally formed from copper, aluminum, a copper alloy, an aluminum alloy, or a combination thereof.

In this embodiment, a conventional power transistor or device, here a power metal-oxide-semiconductor field-effect transistor (MOSFET) 104, is formed in the substrate. The MOSFET 104 is shown in outline form since the structure of the MOSFET 104 is below the metal layers 102 and is normally not visible. In a top metal layer of the metal layers 102, two conductors 106, 108 are shown connecting to respective source and drain diffusions (not shown) of the MOSFET 104 using conventional conductive vias 110. The conductor 106 terminates in a bond pad 112, disposed near the MOSFET 104, for an external interconnection using a bond wire or ball bond (not shown). Similarly, the conductor 108 terminates in a bond pad 114 distant from the MOSFET 104. Also shown in the top metal layer of the metal layers 102 is a conductor 116 connecting to a gate conductor (not shown) of the MOSFET 104 using conductive vias 118. The conductive via 120, shown at the end of the conductor 116 disposed away from the MOSFET 104, connects the conductor 116 to other components (not shown) in the substrate or conductors in the metal layers 102 below the conductors 106, 108, and 116, as required.

The conductors 106 and 108 are shown being wider than other conductors on the IC 100 because they are designed to carry significantly more current than the other conductors and need to have a lower resistance than the other conductors, e.g., the conductor 116.

When the MOSFET 104 is conducting current, it can generate heat that spreads out through the IC 100. As a consequence, the region of the IC 100 proximate or within the MOSFET 104 will be hotter than the rest of the IC 100, forming what is generally referred to as a "hotspot" 122. Under abnormal conditions such as an overload, where the IC 100 is attempting to provide a regulated voltage to a short circuit load for example, the amount of heat generated by the MOSFET 104 might heat the IC 100 as a whole to a temperature that, if left unchecked, will alone irreversibly damage the IC 100. To counter that condition, a protective circuit might be provided (not shown) that inhibits or disables the MOSFET 104 from conducting when a temperature measured on the IC 100 but spaced away from the hotspot 122 meets or exceeds a maximum temperature, e.g., 175° C., allowing the IC 100 to cool down. Once the temperature of the IC 100 cools to below a safe operating temperature e.g., 150° C., the protective circuit allows the MOSFET 104 to again conduct current. These temperatures are typically chosen so that a temperature in the vicinity of the hotspot 122 (near the MOSFET 104 in this example) does not reach a temperature so high that localized damage occurs in and surrounding the hotspot 122 even though the rest of the IC 100 is not nearly hot enough to be damaged.

Until the abnormal condition is rectified, the temperature of the IC 100 might cycle repeatedly between the maximum temperature and the safe operating temperature. In practice and depending on the packaging the IC 100 is disposed in (e.g., SOT-8, TO-92, etc.) and the amount of heat the MOSFET 104 is generating, the temperature cycling can occur at rates from a few cycles per second to hundreds of cycles per second. While the temperature limits are low enough so that no immediate damage occurs to the IC 100 per se, the repeated temperature cycling has a deleterious effect on the metal conductors in the IC 100, namely an irreversible increase in the resistance of the metal conductors and possible bond pad interconnection failures. Because the metal conductors proximate the hotspot 122 (typically the MOSFET 104) experiences the highest temperatures as well as the largest temperature variation during a thermal cycle compared to the rest of the conductors on the IC 100, those conductors proximate the hotspot 122 will experience the highest stress of all the conductors. The accumulated effect of repeatedly stressing the conductors by thermal cycling is an increase in the end-to-end resistance of those conductors. Further, the accumulated effects of the stress might be most predominant in the top metal layer of the metal layers 102 of the IC 100 where the conductor currents are generally the highest and the bond pad interconnects are formed. However, the resulting increase in resistance of individual conductors might have little to no effect on the operation of the IC 100 or it can cause complete functional failure of the IC 100. For example, a small increase in the resistance of the conductor 116 connecting to the gate of the MOSFET 104 will likely have a minimal effect on chip functionality since it carries little current. However, because the conductors 106 and 108 are designed to carry significant amounts of current, e.g., peak currents in excess of 50 amperes, a small increase in the resistance of either of those conductors might cause a functional failure of the IC 100. The overall result is that the top metal conductors nearest the hotspot 122 are most likely to fail due to an unacceptable increase in resistance of those conductors.

Generally, it is difficult to directly measure the resistance of one or more current-carrying conductors in the IC 100 because the conductors might be carrying high voltages, high currents, or high-frequency signals, etc., that can interfere with the resistance measurement. Thus, it is desirable to provide a technique for determining whether the IC 100 is about to fail (i.e., an imminent failure of the IC 100) due to one or more of the metal conductors 106, 108 in the IC 100 increasing in resistance above a threshold amount as a result of the above-described thermal cycling of the IC 100.

To monitor the resistance of the conductor 108, in one embodiment, a sense conductor 130 is disposed adjacent to the conductor 108 and preferably close to the MOSFET 104 but is not electrically connected to the conductor 108. The sense conductor 130 is subject to approximately the same stress conditions (e.g., mechanical stresses and temperatures) as the conductor 108 so that a change in the resistance of the sense conductor 130 approximately tracks a change in the resistance of the conductor 108. Preferably, the sense conductor 130 is made of the same metal as the conductor 108 and formed in the same metal layer 102 as the conductor 108. Alternatively, the sense conductor 130 is disposed in another metal layer but still adjacent the conductor 108, e.g., disposed in a metal layer 102 immediately above or below the conductor 108 and parallel therewith. Since the sense conductor 130 might carry only a fraction of the current carried by the conductor 108, the cross-sectional area of the sense conductor 130 can be less than the cross-sectional area of the conductor 108, as measured along the dashed line X-X shown in FIG. 1.

As explained above, changes in the resistance of the sense conductor 130 approximately tracks changes in the resistance of the conductor 108. Thus, as the resistance of the conductor 108 increases due to the accumulative effects of thermal cycling, the resistance of the sense conductor 130 correspondingly increases. By comparing the resistance of the sense conductor 130 to a calculated resistance value or to the resistance of another on-chip (reference) conductor that is not subject to the same amount of thermal cycling, a determination can be made as to whether or not the resistance of the sense conductor 130, and, by implication, the conductor 108, has exceeded a threshold amount, indicating that the IC 100 is about to fail.

The metals used form the conductors 106, 108, 116, and 130 (e.g., aluminum, copper, or alloys thereof) have a thermal or temperature coefficient of resistivity (a) that varies, for purposes here, proportionally with temperature, so that the resistance of the conductor varies proportionally with the temperature of conductor. For example, aluminum and copper both have a temperature coefficient of resistivity (a) of approximately $4 \times 10^{-3}/°$ C. at room temperature ($20°$ C.) A reference conductor 140 is provided, in one embodiment, as a way to compensate for any change in resistance of the sense conductor 130 due to temperature (non-thermal cycling) effects, thereby allowing measurement of the effects of accumulated thermal cycling on the sense conductor 130 and, by inference, on the conductor 108. The reference conductor 140 is disposed in the IC 100 and spaced away from the sense conductor 130, the conductor 108, and the MOSFET 104 so that it is subject to less temperature cycling compared to that of the sense conductor 130 (and the conductor 108) and, hence, is not affected by the thermal cycling as much as the sense conductor 130. However, the temperature of the reference conductor 140 is similar enough in temperature to the temperature of the sense conductor 130 so that the resistance of the reference conductor 140 at least partially tracks the resistance of the sense conductor 130 due to temperature variations while not appreciably changing resistance due to thermal cycling. The reference conductor 140 is preferably made of the same metal as the conductor 130. In addition, the reference conductor 140 is preferably formed in the same metal layer 102 as the sense conductor 130, e.g., the top metal layer. Doing so will at least partially cancel variations in metal conductor widths and thickness occurring during the deposition, lithographic, and etch processes used to form the metal conductors.

Conductive vias 132 and metal conductors (not shown) below the sense conductor 130, couple the sense conductor 130 to failure-prediction circuitry 150 (shown here in an exemplary outline form since the circuitry is formed in the substrate and is normally not visible). Similarly, conductive vias 142 couple the reference conductor 140 to the failure-prediction circuitry 150. In one embodiment, the failure-prediction circuitry 150 uses both the sense conductor 130 and the reference conductor 140 to determine if the IC 100 is about to fail due to accumulated thermal cycling. As will be described in more detail in connection with FIG. 2, the failure-prediction circuitry 150 compares the resistance of the sense conductor 130 to that of the reference conductor 140 by applying currents to the conductors to generate a voltage across each of the conductors 130, 140 and then compares the generated voltages to each other.

Assuming the conductors 130, 140 are at approximately the same temperature, the reference conductor 140 is designed to have a resistance (R140) substantially equal to R130/δ, where R130 is the resistance of the sense metal conductor 130 prior to the thermal cycling (i.e., the initial resistance of the metal conductor 130), and δ is a scaling factor between zero and one, as will be described in more detail below. As is well known in the art, the resistance of a uniformly sized conductor is approximately equal to pl/A, where p is the resistivity of the conductor (measured in units of ohm-cm measured at a reference temperature, e.g., room temperature, typically $20°$ C.), l is the length of the conductor in cm, and A is the cross-sectional area of the conductor in cm$^2$. Thus, to make the resistance R140 of the conductor 140 greater than the resistance R130 of the conductor 130, the reference conductor 140 is made longer, narrower (i.e., a smaller cross-section area), or a combination thereof, than that of the sense conductor 130.

Taking into account the aforementioned effect of temperature on the resistance of the conductors on the IC 100, the resistance of reference conductor 140 is substantially equal to the following over temperature:

$$(1+\alpha(T-Tr))R130/\delta \qquad (1)$$

where T is the temperature of the conductor 140, α is a temperature coefficient of resistance of the metal used to form the metal conductors (e.g., the sense conductor 130, the reference conductor 140, and the conductor 108) at room temperature Tr, and R130 and δ are as defined above. Based on the choice of the scaling factor δ, the resistance of the conductor 140 serves as a temperature-dependent resistance threshold value that is used to determine if the resistance of the sense conductor 130 (and, correspondingly, the conductor 108) has increased sufficiently to indicate that the IC 100 is subject to imminent failure, i.e., it will soon fail due to the effects of accumulated thermal cycling as described above.

Figure 2:
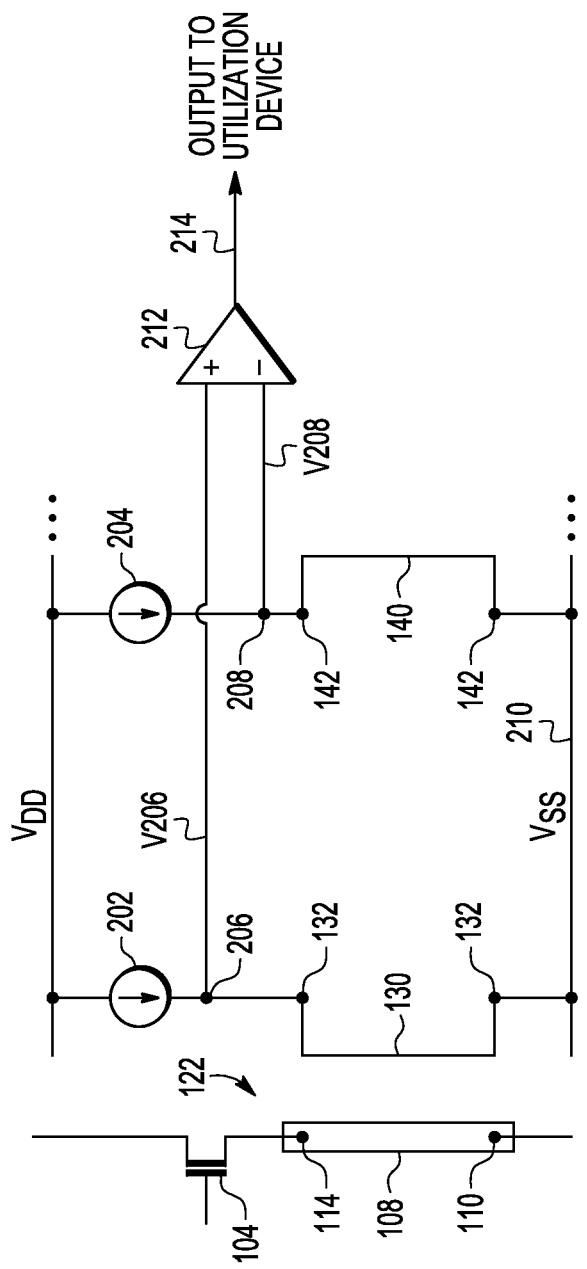
FIG. 2 is a schematic circuit diagram of one embodiment of the failure-prediction circuit implemented in the integrated circuit of FIG. 1.

FIG. 2 is a schematic diagram of one embodiment of the failure-prediction circuit 150 of FIG. 1. Here, the failure-prediction circuit 150 is configured to generate or assert an output indicating that the IC 100 will soon fail when the resistance of the sense metal conductor 130 is greater than the resistance of the reference metal conductor 140. For convenience, the MOSFET 104, the conductor 108, and the hotspot 122 from FIG. 1 are shown proximate the sense conductor 130 as described above.

To measure the resistances of the conductors 130 and 140, a current is injected by current sources 202, 204 into nodes 206, 208, respectively. The currents then pass through the respective conductors 130, 140 to a common conductor or node 210. In accordance with Ohm's Law (V=IR, where V is the resulting voltage, measured in volts, across a resistor R, measured in ohms, passing a current I, measured in amperes), the current passing through the conductors 130, 140 will result in each node 206, 208 having thereon a voltage proportional to the respective conductor's resistance. In this embodiment, the voltages on the nodes 206 and 208 are shown as sense voltage V206 and threshold voltage V208, respectively, and are measured with respect to the common node 210 (Vss or ground).

A voltage comparator 212 receives at the inputs thereof the voltages V206 and V208. The comparator 212 compares the voltage V206 with respect to the voltage V208 and as long the sense voltage V206 is less than the threshold voltage V208, the output 214 of the comparator 212 is low, e.g., the comparator 212 produces a logical zero output. However, once the voltage V206 exceeds the voltage V208, the output 214 is high, e.g., the comparator 212 produces a logical one output indicating that the IC 100 is about to fail.

In one embodiment, the currents supplied by the current sources 202 and 204 are substantially equal. Thus, to ensure that the voltage V206 is less than the voltage V208 before thermal cycling of the IC 100 (FIG. 1) begins, the resistance of the reference conductor 140 is made greater than that of the sense conductor 130 by sizing (scaling) the conductors as described above. In one exemplary embodiment, the resistance R130 of the sense conductor 130 is between 30% and 80% of the resistance R140 of the reference conductor 140, although other values can be used. The scaling of the resistance of the reference conductor 140 to the resistance of the sense conductor 130, using the scaling factor δ described above, results in a like scaling of the initial (pre-thermal cycling) reference voltage V208 to the sense voltage V206. As used here, 0<δ<1, and δ typically ranges from 0.3 (30%) to 0.8 (80%). Exemplary resistances of the conductors 130 and 140 are 20Ω and 30Ω, respectively, and the current supplied by both current sources 202, 204 is approximately 1 mA.

In an alternative embodiment, the initial resistances (before thermal cycling) of the sense and reference conductors 130, 140 are substantially the same. In this embodiment, the current supplied by the current source 204 is greater than that supplied by the current source 202 such that the voltage V206 will be less than the voltage V208 before thermal cycling. To do so, the current supplied by the current source 202 is scaled to the current supplied by the current source 204 by the scaling factor δ. It is well known in the art to size transistors (not shown) in the current sources 202, 204 appropriately so that the current source 202 will produce a current therefrom approximately equal to the current supplied by the current source 204 scaled by the scaling factor δ.

It is understood that a combination of the above techniques for scaling the resistances of the conductors 130, 140 and the currents supplied by the current sources 202, 204 might be used; the end result is that the voltage V206 is approximately equal to the voltage V208 scaled by the scaling factor δ, i.e., V206≈δV208, before thermal cycling of the conductors occurs. Further, the current sources 202, 204 might be adjustable, individually or concurrently, and might be selectively enabled to save power, i.e., turned off when not used.

Because the temperature of the IC 100 can vary considerably during normal operation (e.g., over a range in excess of 175° C.), the resistances of the conductors 130 and 140 will also vary considerably with temperature. Although, during normal operation, the reference conductor 140 is cooler than the sense conductor 130, the difference in temperature is not so great as to cause a significant temperature-dependent difference between the voltages V206 and V208. Hence, the comparing the temperature-dependent sense voltage V206 to the equally temperature-dependent threshold voltage V208 by the voltage comparator 212 will be essentially independent of the temperature of the IC 100, making it possible to detect a change in the resistance of the sense conductor 130 due to the accumulated effects of thermal cycling.

Figure 3:
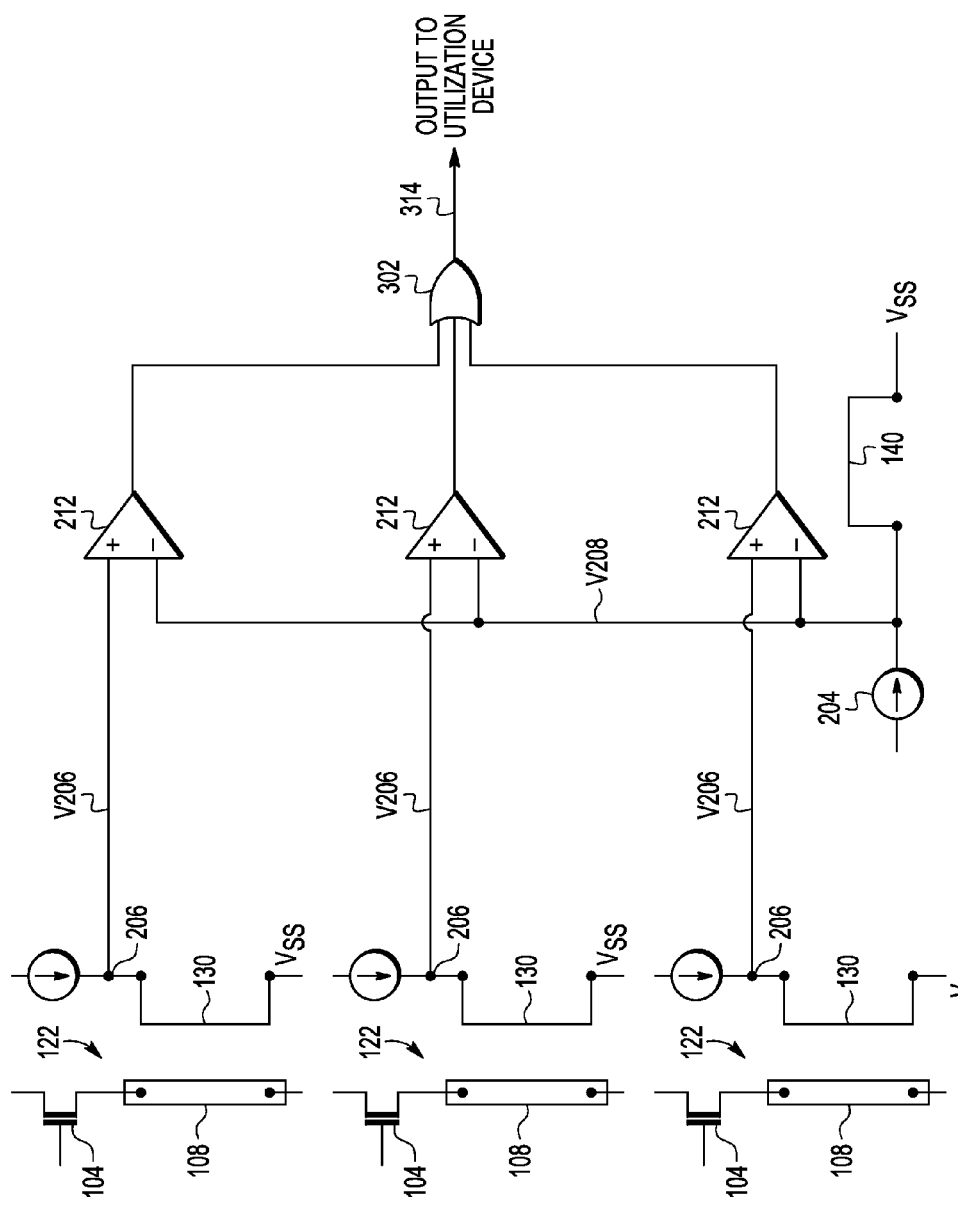
FIG. 3 is a schematic circuit diagram of another embodiment of the failure-prediction circuit implemented in the integrated circuit shown in FIG. 1.

In FIG. 3, an alternative embodiment of the failure-prediction circuit 150 in FIG. 1 is shown. Here, multiple MOSFETs 104/hotspots 122 are spread over the IC 100 (FIG. 1), each hotspot 122 requiring individual localized sensing using a separate sense conductor 130. In this embodiment, a circuit 300 uses a single reference conductor 140 to generate the temperature-dependent threshold voltage V208. The temperature-dependent threshold voltage V208 is compared to the multiple temperature-dependent sense voltages V206 by corresponding voltage comparators 212. The outputs of the voltage comparators 212 are combined by OR gate 302 to produce the output 314. In this embodiment, the output 314 is high, e.g., the OR gate produces a logical one on the output 314, when one or more of the sense voltages V206 exceeds the temperature-dependent threshold voltage V208. It is understood that, while three sense conductors 130 and corresponding comparators 212 are shown, two or more sense conductors 130 and voltage comparators 212 might be used in this or a similar embodiment with the OR gate 302 having the same number of inputs as there are voltage comparators 212.

Figure 4:
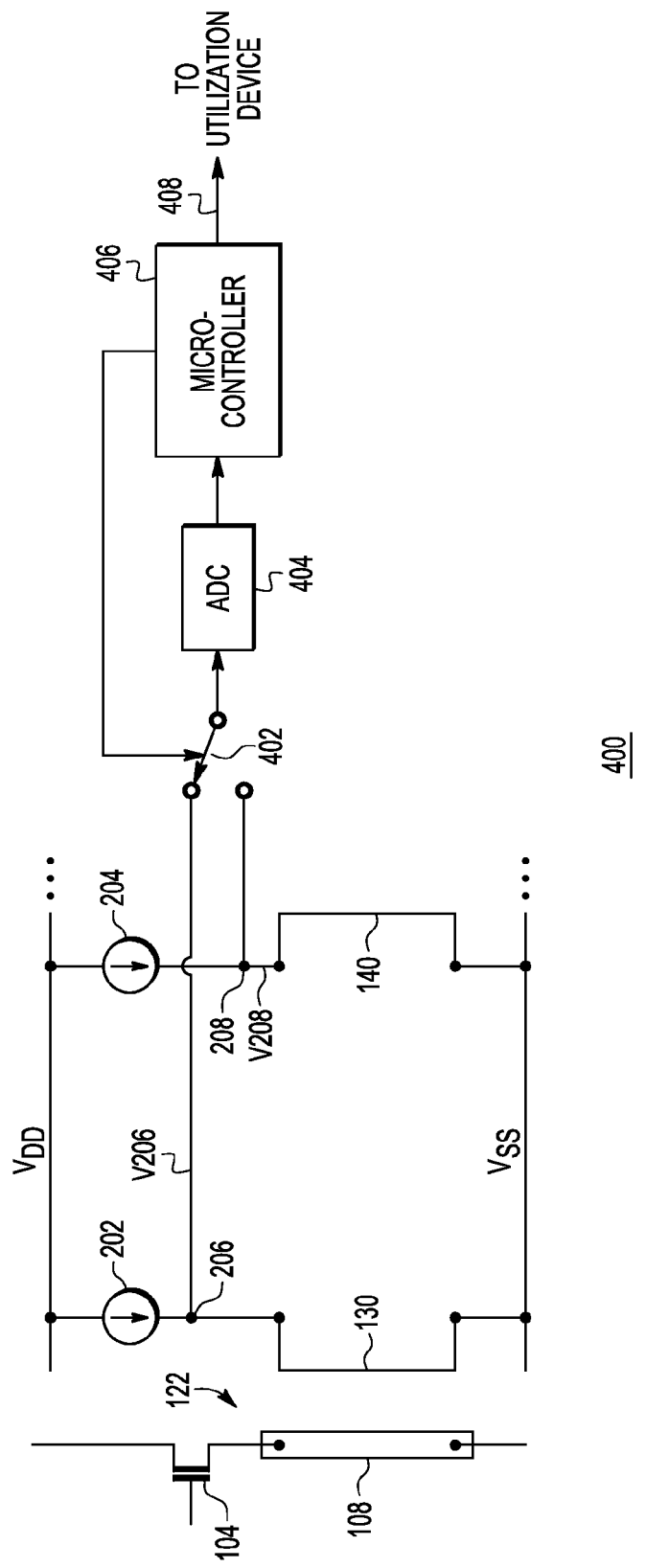
FIG. 4 is a schematic block diagram of an alternative embodiment of the failure-prediction circuit implemented in the integrated circuit shown in FIG. 1.

In FIG. 4, another alternative embodiment of the failure-prediction circuit 150 in FIG. 1 is shown where the comparator 212 in FIG. 2 is replaced in the circuit 400 with a switch 402, an analog-to-digital converter (ADC) 404, and a microcontroller 406. The microcontroller 406 controls the switch 402 to select which voltage, V206 or V208, the ADC 404 digitizes. The microcontroller 406 reads or accepts both of the digitized voltages and compares the digitized voltage values to each other. When the value of the digitized voltage V206 exceeds the value of the digitized voltage V208, the microcontroller 406 generates a signal (e.g., a flag or the like) on output 408 indicating that the IC 100 will soon fail. The switch 402, the ADC 404, and the microcontroller 406 might be implemented in the IC 100 or on a separate integrated circuit.

Figure 5:
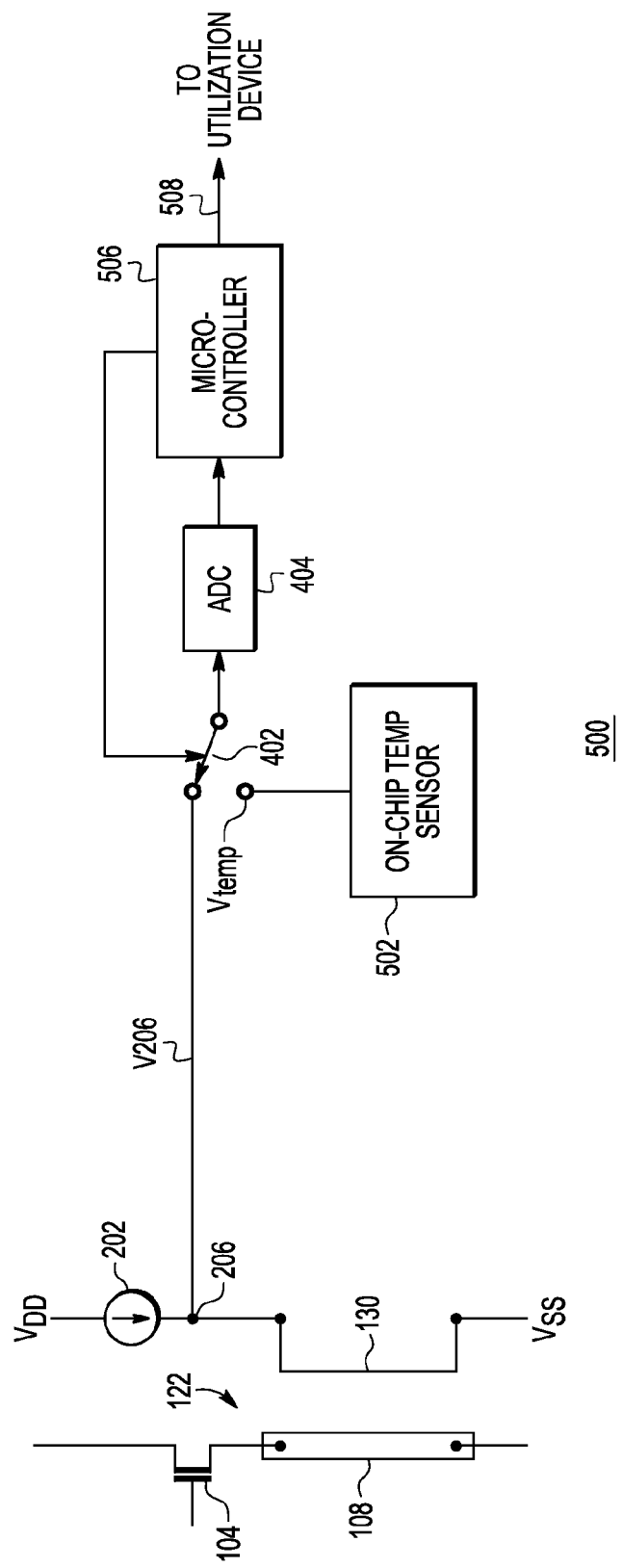
FIG. 5 is a schematic block diagram of another alternative embodiment of the failure-prediction circuit implemented in the integrated circuit shown in FIG. 1.

Another alternative embodiment of the failure-prediction circuit 150 in FIG. 1 is shown in FIG. 5, where the reference conductor 140 and associated circuitry shown in FIG. 2 are not provided. Instead, the circuit 500 includes a conventional on-chip temperature sensor 502 (e.g., a conventional current-proportional-to-absolute-temperature (IPAT) generator and a current-to-voltage converter, such as an on-chip resistor with a low temperature coefficient or a precision off-chip resistor) that produces a voltage Vtemp that is proportional to the temperature of the IC 100 and, like the reference conductor 140 (FIG. 1), the sensor 502 is disposed away from the MOSFET 104/hotspot 122 so that it is subject to less variation in temperature compared to that of the sense conductor 130. In this embodiment, a digital value equivalent of the temperature-dependent threshold voltage V208 is generated without using the reference conductor 140. Instead, the microcontroller 506 generates the digital value of the temperature-dependent threshold voltage V208 in accordance with the following relationship:

$$(1+\alpha(T-Tr))R130I/\delta \qquad (2)$$

where T is a temperature measured on the IC 100 (here, the value of T is calculated from Vtemp by the microcontroller 206), α is a temperature coefficient of resistance of the metal used to form the metal conductors (e.g., the sense conductor 130 and the conductor 108), R130 is an initial resistance of the sense conductor 130 prior to the thermal cycling, I is a value approximately equal to the current supplied by the current source 202, and δ is the above-described scaling factor. The sensor 502 might be the same as that used by the above-described protective circuit that disables the MOSFET 104 when the temperature of the IC 100 gets too hot.

The microcontroller 506 controls the switch 402 to select which voltage, the temperature-dependent sense voltage V206 or Vtemp, the ADC 404 digitizes. The microcontroller 506 reads or accepts both digitized voltage values, calculates the threshold value determined in accordance with Eq. 2, and then compares the value of the digitized sense voltage V206 to the calculated threshold value. When the value of the digitized sense voltage exceeds the calculated value, the microcontroller 506 generates a signal (e.g., a flag or the like) on output 508 indicating that the IC 100 will soon fail. This process is illustrated in a flow chart shown in FIG. 6.

Figure 6:
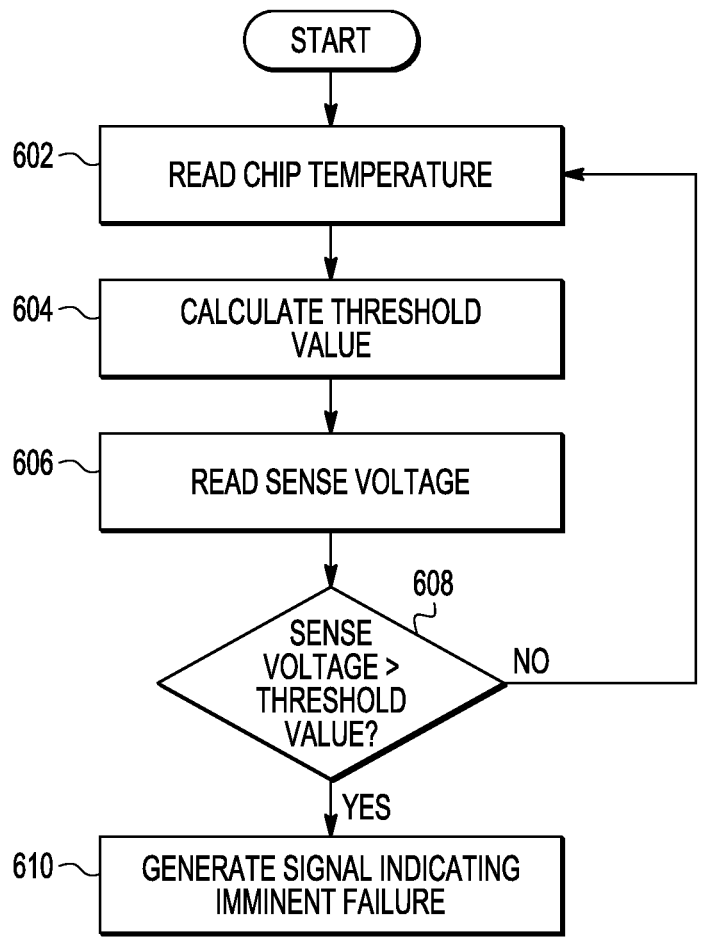
FIG. 6 is a flow chart of exemplary steps executed by a microcontroller used in the failure-prediction circuit of FIG. 5.

In FIG. 6, the process 600 implemented in the microcontroller 506 in FIG. 5 begins with step 602 where the switch 402 is configured by the microcontroller 506 to couple the voltage Vtemp from the temperature sensor 502 to the ADC 404 for digitizing. The value of the digitized voltage Vtemp is then read by the microcontroller 506.

Next, in step 604, the microcontroller 506 calculates the temperature-adjusted threshold value in accordance with Eq. 2.

Next, in step 606, the microcontroller 506 configures the switch 402 to couple the temperature-dependent sense voltage V206 to the ADC 404 for digitizing and then the digitized voltage value is read by the microcontroller 506.

In step 608, the microcontroller 506 compares the digitized sense voltage value to the calculated temperature-adjusted threshold value calculated in step 604 and, if the digitized sense voltage value is not greater than the calculated threshold value, control passes back to step 602 to continue monitoring of the resistance of the sense conductor 130. If, however, the digitized sense voltage value does exceed the calculated threshold voltage value, then control passes to step 610 where the microcontroller 506 generates a signal on output 508 indicating that failure of the IC 100 is imminent.

It should be understood that the steps of the exemplary method set forth herein are not necessarily required to be performed in the order described, and the order of the steps of such method should be understood to be merely exemplary. Likewise, additional steps may be included in such method, and certain steps may be omitted or combined, in such method consistent with various embodiments of the invention.

Although the invention has been described using relative terms such as "front", "back", "top", "bottom", "over", "above", "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used in the claims to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. An integrated circuit, comprising:
a heat-generating element;
a first metal conductor electrically connected to the heat-generating element;
a second metal conductor located adjacent the first metal conductor; and
a failure-prediction circuit, electrically connected to the second metal conductor, configured to generate at an output a signal when a resistance of the second metal conductor is greater than a temperature-dependent threshold value;
wherein the signal indicates that the integrated circuit will soon fail.

2. The integrated circuit of claim 1, wherein:
the integrated circuit thermally cycles in response to the heat-generating element;
a resistance of the first metal conductor increases in response to accumulated thermal cycling by the integrated circuit; and
an increase in the resistance of the second metal conductor tracks the increase in the resistance of the first metal conductor.

3. The integrated circuit of claim 1, wherein the temperature-dependent threshold value is proportional to:

$$(1+\alpha(T-Tr))Ri/\delta$$

where T is a temperature measured on the integrated circuit, Tr is room temperature, α is a temperature coefficient of resistance of the metal used to form the first and second metal conductors, Ri is an initial resistance of the second metal conductor, and δ is a scaling factor, where 0<δ<1.

4. The integrated circuit of claim 1, wherein the failure-prediction circuit comprises:
a current source coupled to the second conductor at a node and configured to supply a current to the second conductor;
wherein, in response to the current, a voltage is developed across the second conductor, and the temperature-dependent threshold value is a value substantially equal to:

$$(1+\alpha(T-Tr))RiI/\delta$$

where T is a temperature measured on the integrated circuit, Tr is room temperature, α is a temperature coefficient of resistance of the metal used to form the first and second metal conductors, Ri is an initial resistance of the second metal conductor, I is the current supplied by the current source, and δ is a scaling factor, where 0<δ<1.

5. The integrated circuit of claim 1, wherein the integrated circuit has a plurality of metal layers, and the first and second metal conductors are formed in a top metal layer.

6. The integrated circuit of claim 1, wherein the integrated circuit has a plurality of metal layers, the first metal conductor is disposed in a top metal layer, and the second metal conductor is disposed in a metal layer other than the top metal layer.

7. The integrated circuit of claim 1, wherein a cross-sectional area of the first metal conductor is greater than a corresponding cross-section area of the second metal conductor.

8. The integrated circuit of claim 1, further comprising:
a third metal conductor, coupled to the failure-prediction circuit, disposed away from the first and second metal conductors and formed of the same metal as the second metal conductor;
wherein the temperature-dependent threshold value is proportional to a resistance of the third metal conductor.

9. The integrated circuit of claim 8 wherein, when the heat-generating element is generating heat, the first and second metal conductors have substantially the same temperatures on the integrated circuit, and the third metal conductor has a temperature different from the temperatures of the first and second metal conductors.

10. The integrated circuit of claim 1, wherein the failure-prediction circuit comprises:
first, second, and common nodes;
a third metal conductor coupled between the second node and the common node and disposed away from the first and second metal conductors;
a first current source coupled to the first node;
a second current source coupled to the second node; and
a voltage comparator having a first input coupled to the first node, a second input coupled to the second node, and an output coupled to the output of the failure-prediction circuit, wherein:
the second metal conductor is coupled between the first node and the common node;
the first and second current sources are configured to supply respective currents to the first and second nodes resulting in respective first and second voltages thereon relative to the common node; and
the first voltage is less than the second voltage before thermal cycling of the integrated circuit occurs in response to the heat-generating element.

11. The integrated circuit of claim 10, wherein:
a resistance of the first metal conductor increases in response to accumulated thermal cycling of the integrated circuit;
an increase in a resistance of the second metal conductor tracks the increase in resistance of the first metal conductor; and
in response to the increase in the resistance of the second metal conductor, the first voltage increases relative to the second voltage.

12. The integrated circuit of claim 10, wherein the first voltage, before the thermal cycling occurs, is substantially equal to the second voltage multiplied by a scaling factor $\delta$, where $0<\delta<1$.

13. The integrated circuit of claim 12, wherein:
the currents supplied by the first and second current sources are substantially equal; and
an initial resistance of the second metal conductor is substantially equal to an initial resistance of the third conductor multiplied by the scaling factor $\delta$, the initial resistances being resistances of the respective conductors before the thermal cycling occurs.

14. The integrated circuit of claim 12, wherein:
the second and third conductors have substantially equal initial resistances; and
the first current source is configured to supply a current that is substantially equal to a current supplied by the second current source multiplied by the scaling factor $\delta$, the initial resistances being resistances of the respective conductors before the thermal cycling occurs.

15. The integrated circuit of claim 12, wherein $0.3<\delta<0.8$.

16. The integrated circuit of claim 12, wherein:
the integrated circuit has a plurality of metal layers;
the first metal conductor is formed in a top metal layer; and
the second and third metal conductors are formed in the same metal layer.

17. The integrated circuit of claim 1, further comprising:
a plurality of the heat-generating elements;
a plurality of the first metal conductors, each of the first metal conductors coupled to a corresponding one of the heat-generating elements; and
a plurality of the second metal conductors, each of the second metal conductors adjacent to a corresponding one of the first metal conductors;
wherein the failure-prediction circuit is coupled to the second metal conductors and the signal is generated when a resistance of at least one of the second metal conductors is greater than the temperature-dependent threshold value.

18. The integrated circuit of claim 1, wherein the failure-prediction circuit comprises:
first, second, and common nodes, the second metal conductor being coupled between the first node and the common node;
a third metal conductor coupled between the second node and the common node and disposed away from the first and second metal conductors;
a first current source coupled to the first node and configured to supply current to the first node resulting in a first voltage thereon relative to the common node;
a second current source coupled to the second node and configured to supply a current to the second node resulting in a second voltage thereon relative to the common node;
a switch having an output, a control input, a first signal input coupled to the first node, and a second signal input coupled to the second node;
an analog-to-digital converter having an input coupled to the output of the switch and having an output; and
a processor having an input coupled to the output of the analog-to-digital converter, a control output coupled to the control input of the switch, and a signal output coupled to the output of the failure-prediction circuit;
wherein the first voltage is less than the second voltage before thermal cycling of the integrated circuit occurs in response to the heat-generating element; and
wherein the processor is configured to:
configure the switch to couple the first voltage to the input of the analog-to-digital converter;
read a digitized first voltage value from the analog-to-digital converter;
configure the switch to couple the second voltage to the input of the analog-to-digital converter;
read a digitized second voltage value from the analog-to-digital converter;
compare the digitized first voltage value to the digitized second voltage value; and
generate, on the condition that the digitized first voltage value exceeds the digitized second voltage value, a signal at the signal output indicating that the integrated circuit will soon fail.

19. The integrated circuit of claim 1, wherein the failure-prediction circuit comprises:

first, second, and common nodes, the second metal conductor being coupled between the first node and the common node;

a current source coupled to the first node and configured to supply a current to the first node resulting in a first voltage thereon relative to the common node;

a temperature sensor coupled to the second node and disposed away from the first and second metal conductors, the temperature sensor configured to provide at the second node a second voltage, the second voltage related to a temperature of the integrated circuit;

a switch having an output, a control input, a first signal input coupled to the first node, and a second signal input coupled to the second node;

an analog-to-digital converter coupled to the output of the switch and having an output; and a processor having an input coupled to the output of the analog-to-digital converter, a control output coupled to the control input of the switch, and a signal output coupled to the output of the failure-prediction circuit;

wherein the processor is configured to:

configure the switch to couple the first voltage to the input of the analog-to-digital converter;

read a digitized first voltage value from the analog-to-digital converter;

configure the switch to couple the second voltage to the input of the analog-to-digital converter;

read a digitized second voltage value from the analog-to-digital converter;

calculate the temperature-dependent threshold value from the digitized second voltage value;

compare the digitized first voltage value to the calculated temperature-dependent threshold value; and generate, on the condition that the digitized first voltage value exceeds the calculated temperature-dependent threshold value, a signal at the signal output indicating that the integrated circuit will soon fail.

* * * * *